(12) United States Patent
Kim et al.

(10) Patent No.: US 9,740,234 B1
(45) Date of Patent: Aug. 22, 2017

(54) ON-CHIP CLOCK CONTROLLER

(71) Applicant: QUALCOMM Incorporated, San Diego, CA (US)

(72) Inventors: Hong Kim, Austin, TX (US); Paul Policke, Cedar Park, TX (US); Anirudh Kadiyala, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/087,171

(22) Filed: Mar. 31, 2016

(51) Int. Cl.
| | | |
|---|---|---|
| *G06F 1/04* | (2006.01) |
| *G06F 1/06* | (2006.01) |
| *H03K 3/037* | (2006.01) |
| *G06F 13/40* | (2006.01) |
| *H03K 5/135* | (2006.01) |
| *H03K 5/1252* | (2006.01) |
| *H03K 3/70* | (2006.01) |
| *H03K 3/356* | (2006.01) |
| *H03K 17/284* | (2006.01) |

(52) U.S. Cl.
CPC .............. *G06F 1/06* (2013.01); *G06F 1/04* (2013.01); *G06F 13/4072* (2013.01); *H03K 3/037* (2013.01); *H03K 3/356052* (2013.01); *H03K 3/70* (2013.01); *H03K 5/1252* (2013.01); *H03K 5/135* (2013.01); *H03K 17/284* (2013.01)

(58) Field of Classification Search
CPC ...... G01R 31/318552; G01R 31/31727; G01R 31/318536; G01R 31/31922; H03K 3/037; H03K 2217/0054; H03K 3/012; H03K 3/013; H03K 5/1252; H03K 19/096; H03K 23/40; H03K 23/58; G06F 1/04; G06F 1/10; G11C 7/106; G11C 7/1087
See application file for complete search history.

(56) References Cited

U.S. PATENT DOCUMENTS

| | | | | |
|---|---|---|---|---|
| 5,537,062 A * | 7/1996 | Mote, Jr. | ................ | H03K 5/156 326/93 |
| 7,840,861 B2 * | 11/2010 | Sul | ................... | G01R 31/31855 714/726 |
| 8,164,374 B2 * | 4/2012 | Irie | ..................... | H03K 19/0016 327/291 |
| 8,522,190 B1 * | 8/2013 | Sanghani | ......... | G01R 31/31859 716/103 |
| 8,633,725 B2 | 1/2014 | Gorti | | |
| 8,775,857 B2 | 7/2014 | Khullar | | |
| 2015/0193564 A1 | 7/2015 | Pereira | | |
| 2015/0194951 A1 | 7/2015 | Surgutchik | | |
| 2015/0204945 A1 | 7/2015 | Sanghani | | |

* cited by examiner

*Primary Examiner* — Vibol Tan
(74) *Attorney, Agent, or Firm* — Qualcomm Incorporated-Toler

(57) ABSTRACT

An on-chip clock controller includes a primary clock gating cell and a secondary clock gating cell. The primary clock gating cell includes a first clock input terminal coupled to receive an input clock signal and a first enable input terminal coupled to receive an enable signal. The primary clock gating cell also include a first clock output terminal configured to generate a first output clock signal based at least in part on the input clock signal and the enable signal. The secondary clock gating includes a second clock input terminal coupled to receive the input clock signal and a second clock output terminal configured to generate a second output clock signal based at least in part on the input clock signal. The enable signal is based at least in part on the second output clock signal.

27 Claims, 6 Drawing Sheets

ON-CHIP CLOCK CONTROLLER

I. FIELD

The present disclosure is generally related to an on-chip clock controller.

II. DESCRIPTION OF RELATED ART

Advances in technology have resulted in smaller and more powerful computing devices. For example, there currently exists a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and Internet Protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player.

Wireless devices may include an on-chip clock controller. The on-chip clock controller may include circuitry that enables switching between a first clock signal having a first frequency (e.g., a relatively high frequency) and a second clock signal having a second frequency (e.g., a relatively low frequency). For example, the on-chip clock controller may include multiple multiplexers that are configured to receive the first clock signal and the second clock signal. Each multiplexer may output the first clock signal or the second clock signal based on control signals. However, using multiple multiplexers that switch between slow clock signals and fast clock signals may cause glitches and timing issues at the on-chip clock controller.

III. SUMMARY

According to one implementation of the present disclosure, an on-chip clock controller includes a primary clock gating cell and a secondary clock gating cell. The primary clock gating cell includes a first clock input terminal coupled to receive an input clock signal and a first enable input terminal coupled to receive an enable signal. The primary clock gating cell also includes a first clock output terminal configured to generate a first output clock signal based at least in part on the input clock signal and the enable signal. The secondary clock gating cell includes a second clock input terminal coupled to receive the input clock signal and a second clock output terminal configured to generate a second output clock signal based at least in part on the input clock signal. The enable signal is based at least in part on the second output clock signal.

According to another implementation of the present disclosure, a method of reducing glitches at an on-chip clock controller circuit includes generating a first output clock signal at a primary clock gating cell of the on-chip clock controller circuit. The first output clock signal is generated based at least in part on an input clock signal and an enable signal. The method also includes generating a second output clock signal at a secondary clock gating cell of the on-chip clock controller circuit. The second output clock signal is generated based at least in part on the input clock signal. The enable signal is based at least in part on the second output clock signal, and the input clock signal bypasses multiplexer operations at the on-chip clock controller to reduce glitches at the on-chip clock controller circuit.

According to another implementation of the present disclosure, a non-transitory computer-readable medium includes instructions for reducing glitches at an on-chip clock controller circuit. The instructions, when executed by a processor, cause the processor to perform operations including generating a first output clock signal at a primary clock gating cell of the on-chip clock controller circuit. The first output clock signal is generated based at least in part on an input clock signal and an enable signal. The instructions also cause the processor to generate a second output clock signal at a secondary clock gating cell of the on-chip clock controller circuit. The second output clock signal is generated based at least in part on the input clock signal. The enable signal is based at least in part on the second output clock signal, and the input clock signal bypasses multiplexer operations at the on-chip clock controller to reduce glitches at the on-chip clock controller circuit.

According to another implementation of the present disclosure, an on-chip clock controller circuit includes means for generating a first output clock signal and means for generating a second output clock signal. The means for generating the first output clock signal includes a first clock input terminal coupled to receive an input clock signal and a first enable input terminal coupled to receive an enable signal. The means for generating the first output clock signal includes a first clock output terminal configured to generate the first output clock signal based at least in part on the input clock signal and the enable signal. The means for generating the second output clock signal includes a second clock input terminal coupled to receive the input clock signal and a second clock output terminal configured to generate the second output clock signal based at least in part on the input clock signal. The enable signal is based at least in part on the second output clock signal.

IV. BRIEF DESCRIPTION OF THE DRAWINGS

V. DETAILED DESCRIPTION

Figure 1:
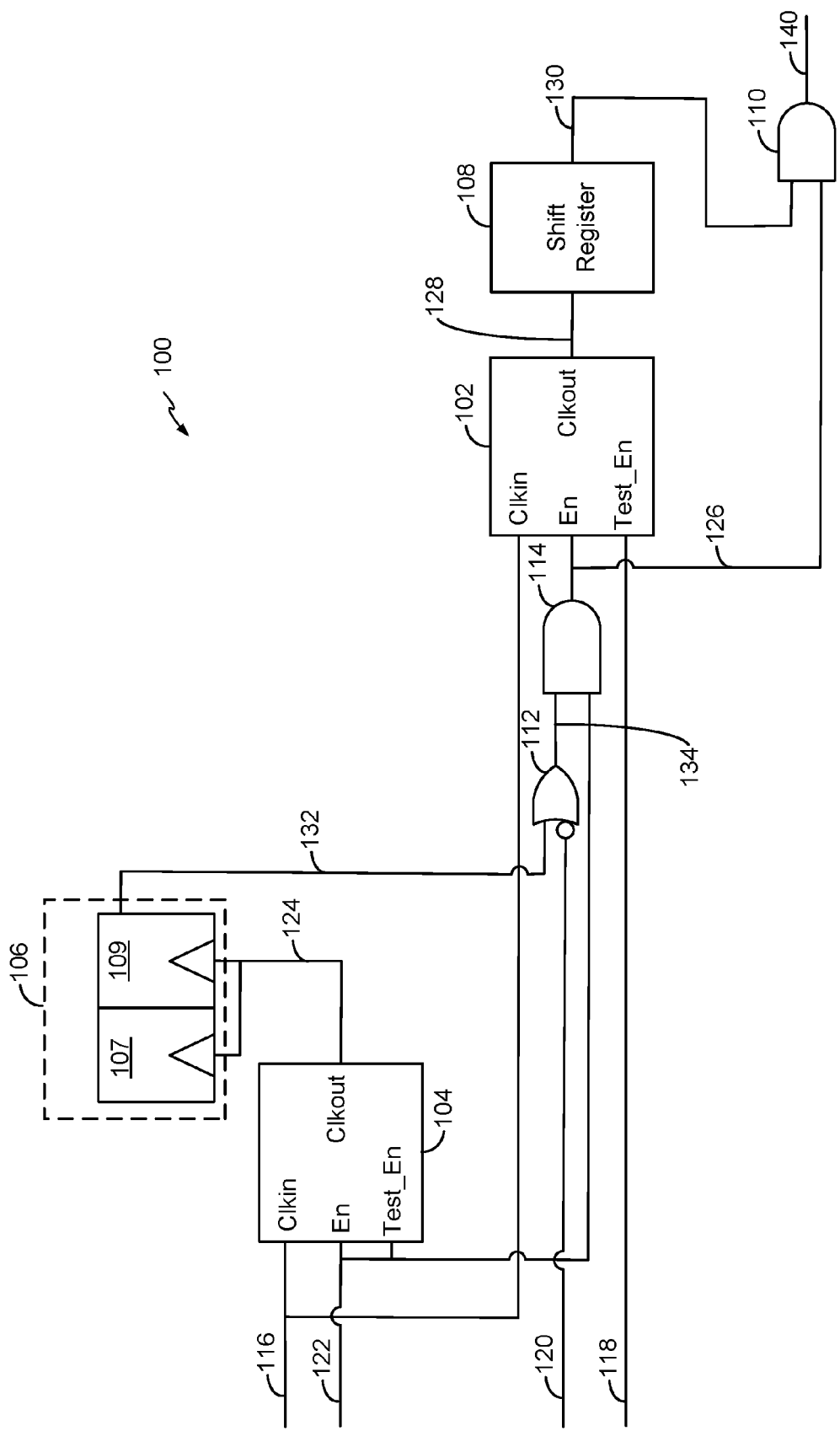
FIG. 1 is an on-chip clock controller (OCC) circuit that is configured to selectively output a first clock signal or a second clock signal.

Referring to FIG. 1, an on-chip clock controller (OCC) circuit 100 that is configured to selectively output a first clock signal or a second clock signal is shown. According to one implementation, the OCC circuit 100 may facilitate multi-clock at-speed testing. The OCC circuit 100 includes a primary clock gating cell 102, a secondary clock gating cell 104, a synchronization circuit 106, and a shift register 108. According to one implementation, the primary clock gating cell 102 includes a first latch, and the secondary clock gating cell 104 includes a second latch. The OCC circuit 100 may be integrated into a communications device (e.g., a mobile phone), a tablet, a laptop, a personal digital assistant (PDA), a set top box, a music player, a video player, an entertainment unit, a navigation device, a fixed location data unit, a drone, a vehicle system, or a computer.

The OCC circuit 100 may facilitate performing at-speed testing for one or more electronic devices. For example, if a central processing unit (CPU) of an electronic device operates at 300 megahertz (MHz), the OCC circuit 100 may be integrated into the electronic device to test operations of the CPU at 300 MHz. The OCC circuit 100 may be configured to generate an OCC clock signal 140 (e.g., an OCC clock enable signal) based on an input clock signal 116, a first test enable signal 118, a delay fault test signal 120, and a second test enable signal 122. As described in greater detail with respect to FIG. 3, during manufacturing testing, flip-flops or latches (not shown in FIG. 1) within the shift register 108 may be connected in one or more scan chains. The scan chains may be used to form serial shift registers for applying input test patterns to combinational logic of an integrated circuit and for reading out the corresponding results. Test patterns may be shifted in the scan chains, functional clock signals may be pulsed to test the integrated circuit during a "capture cycle", and the results may be provided ("shifted out") to output pins and compared to expected results. Capture clock pulses may be applied on the scan chains during the capture cycle, and the captured results may be provided to the output pins for analysis (e.g., "at-speed" testing).

The primary clock gating cell 102 may be configured to generate a first output clock signal 128 based on the input clock signal 116, an enable signal 126, and the first test enable signal 118. The primary clock gating cell 102 includes a first clock input terminal (Clkin) that is coupled to receive the input clock signal 116. As described with respect to FIG. 2, the input clock signal 116 may be a first clock signal having a first frequency (e.g., a relatively high frequency) or a second clock signal having a second frequency (e.g., a relatively low frequency). The primary clock gating cell 102 may also include a first enable input terminal (En) that is coupled to receive the enable signal 126 and a first test enable input terminal (Test En) that is coupled to receive the first test enable signal 118. The primary clock gating cell 102 may also include a first clock output terminal (Clkout) that is configured to generate the first output clock signal 128 based on the input clock signal 116, the enable signal 126, and the first test enable signal 118. The first output clock signal 128 may be provided to the shift register 108. Thus, if the primary clock gating cell 102 is in an active state, the primary clock gating cell 102 may enable the shift register 108 to store data values indicative of a capture pulse or a launch pulse, as described below.

The secondary clock gating cell 104 may be configured to generate a second output clock signal 124 based on the input clock signal 116 and a second test enable signal 122. The secondary clock gating cell 104 includes a second clock input terminal (Clkin) that is coupled to receive the input clock signal 116. The secondary clock gating cell 104 may also include a second enable input terminal (En) that is coupled to receive the second test enable signal 122, and a second test enable input terminal (Test En) that is also coupled to receive the second test enable signal 122. The secondary clock gating cell 104 may also include a second clock output terminal (Clkout) that is configured to generate the second output clock signal 124 based on the input clock signal 116 and the second test enable signal 122. The second output clock signal 124 may be an asynchronous signal that is provided to the synchronization circuit 106.

The synchronization circuit 106 may be configured to generate a synchronization signal 132. The synchronization signal 132 may be a delay signal that indicates whether the OCC circuit 100 is to generate a launch pulse or a capture pulse. The synchronization circuit 106 may be coupled to receive the second output clock signal 124 from the second clock output terminal (Clkout) of the secondary clock gating cell 104. For example, the synchronization circuit 106 may include two registers 107, 109 having clock input terminals. The second output clock signal 124 may be provided to the clock input terminal of each of registers 107, 109 of the synchronization circuit 106. The synchronization circuit 106 may be configured to generate the synchronization signal 132 based at least in part on the second output clock signal 124.

The OCC circuit 100 may also include a logical gate 112. The logical gate 112 may include a first input terminal that is coupled to receive the synchronization signal 132 from the synchronization circuit 106. The logical gate 112 may also include a second input terminal that is coupled to an inverted version of the delay fault test signal 120. The logical gate 112 may also include an output terminal that is configured to generate a preliminary enable signal 134 based on the synchronization signal 132 and the inverted version of the delay fault test signal 120.

The OCC circuit 100 may also include a logical gate 114. The logical gate 114 may include a first input terminal that is coupled to receive the preliminary enable signal 134 from the output terminal of the logical gate 112. The logical gate 114 may also include a second input terminal that is coupled to receive the second test enable signal 122. The logical gate 114 may also include an output terminal that is configured to generate the enable signal 126 based on the preliminary enable signal 134 and the second test enable signal 122.

The shift register 108 may be coupled to receive the first output clock signal 128 from the primary clock gating cell 102. The shift register 108 may be configured to generate a data signal 130 (e.g., a control value) based on the first output clock signal 128. The data signal 130 may have a first logical value (e.g., a logical "0" value) or a second logical value (e.g., a logical "1" value). As described in greater detail with respect to FIG. 3, during a manufacturing test, flip-flops or latches (not shown in FIG. 1) within the shift register 108 may be connected in one or more scan chains. The scan chains may be used to form serial shift registers for applying input test patterns to combinational logic of an integrated circuit and for reading out the corresponding results represented by the data signal 130. Test patterns may be shifted in the scan chains, functional clock signals may be pulsed to test the integrated circuit during a "capture cycle", and the results may be provided ("shifted out") to output pins and compared to expected results. Capture clock pulses may be applied on the scan chains during the capture cycle, and the captured results may be provided to the output pins for analysis.

A logical gate 110 may include a first input terminal that is coupled to receive the data signal 130 from the shift register 108. The logical gate 110 may also include a second input terminal that is coupled to receive the enable signal 126. The logical gate 110 may also include an output terminal that is configured to generate the OCC clock signal 140 based on the data signal 130 and the enable signal 126. The OCC clock signal 140 may toggle if the data signal 130 has the second logical value corresponding to a capture mode and may not toggle if the data signal 130 has the first logical value corresponding to a launch mode. Thus, during manufacturing tests for a transition delay fault, the data signal 130 from the shift register 108 may control whether the OCC clock signal 140 has a capture pulse or a launch pulse.

The OCC circuit 100 of FIG. 1 may reduce glitches based on switching between different frequency clock signals. For example, the input clock signal 116 may bypass multiplexer operations at the OCC circuit 100 to reduce glitches that may otherwise occur if a multiplexer was coupled to the input clock signal 116.

Figure 2:
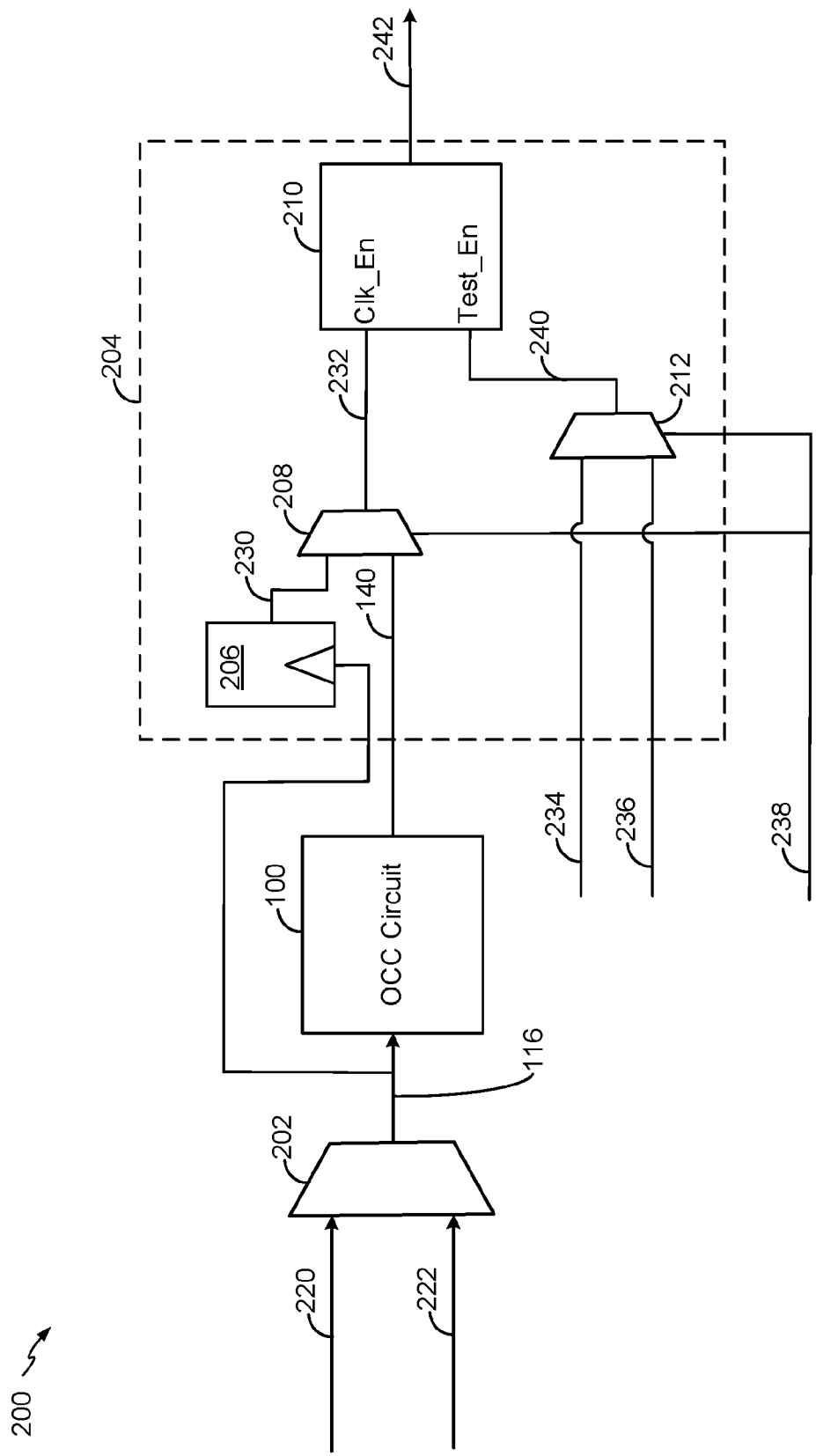
FIG. 2 is a system that is configured to selectively output a first clock signal or a second clock signal.

Referring to FIG. 2, a system 200 that is configured to selectively output a first clock signal or a second clock signal is shown. The system 200 includes the OCC circuit 100, a multiplexer 202, and a clock switching circuit 204.

A first clock signal 220 may be provided to a first input terminal of the multiplexer 202, and a second clock signal 222 may be provided to a second input terminal of the multiplexer 202. The first clock signal 220 may have a first frequency (e.g., a relatively high frequency) and the second clock signal 222 may have a second frequency (e.g., a relatively low frequency). Based on a control signal (not shown), the multiplexer 202 may be configured to output either the first clock signal 220 or the second clock signal 222 as the input clock signal 116.

The clock switching circuit 204 includes a register 206, a multiplexer 208, a clock gating cell 210, and a multiplexer 212. The input clock signal 116 may be provided to a clock input terminal of the register 206. The register 206 may be configured to generate a clock signal 230 in response to receiving the input clock signal 116. The clock signal 230 may be provided to a first input terminal of the multiplexer 208.

The OCC clock signal 140 may be provided to a second input terminal of the multiplexer 208. The multiplexer 208 may be configured to provide the clock signal 230 or the OCC clock signal 140 to a clock enable terminal (Clk En) of the clock gating cell 210. For example, the multiplexer 208 may receive a control signal 238 at a control terminal. If the control signal 238 has a first logical value (e.g., a logical "0" value), the multiplexer 208 may provide the clock signal 230 to the clock gating cell 210 as an enable signal 232. If the control signal 238 has a second logical value (e.g., a logical "1" value), the multiplexer 208 may provide the OCC clock signal 140 to the clock gating cell 210 as the enable signal 232. According to one implementation, the clock signal 230 may have a different frequency than the OCC clock signal 140.

A first test enable signal 234 may be provided to a first input of the multiplexer 212, and a second test enable signal 236 may be provided to a second input of the multiplexer 212. According to one implementation, the first test enable signal 234 may have a different frequency than the second test enable signal 236. The multiplexer 212 may be configured to provide the first test enable signal 234 or the second test enable signal 236 to a test enable terminal (Test En) of the clock gating cell 210. For example, the multiplexer 212 may receive the control signal 238 at a control terminal. If the control signal 238 has the first logical value (e.g., the logical "0" value), the multiplexer 212 may provide the first test enable signal 234 to the clock gating cell 212 as a test enable signal 240. If the control signal 238 has the second logical value (e.g., the logical "1" value), the multiplexer 212 may provide the second test enable signal 236 to the clock gating cell 212 as the test enable signal 240.

The clock gating cell 210 may be configured to generate an output clock signal 242 based on the enable signal 232 and the test enable signal 240. According to one implementation, the clock gating cell 210 may include a clock input terminal (not shown) that is configured to receive the first clock signal 220 or the second clock signal 222. For example, a multiplexer (not shown) may be configured to selectively provide the first clock signal 220 or the second clock signal 220 to the clock input terminal of the clock gating cell 210.

The system 200 of FIG. 2 may reduce glitches at the OCC circuit 100 based on switching between different frequency clock signals. For example, the input clock signal 116 may bypass multiplexer operations at the OCC circuit 100 to reduce glitches that may otherwise occur if a multiplexer, such as the multiplexer 202, was integrated into the OCC circuit 100.

Figure 3:
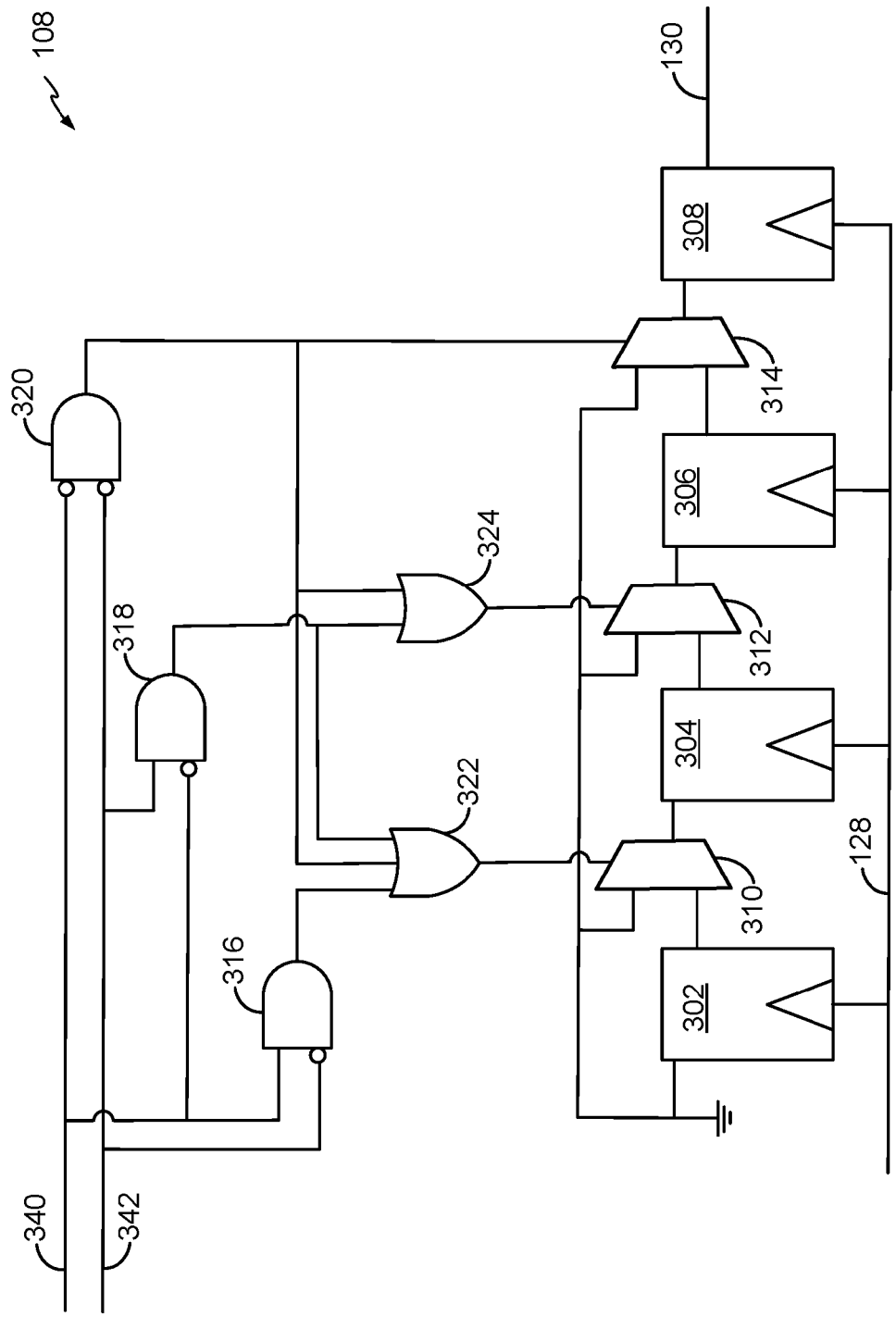
FIG. 3 is a circuit diagram of a shift register included in the OCC circuit of FIG. 1.

Referring to FIG. 3, a circuit diagram of the shift register 108 of FIG. 1 is shown. The shift register 108 includes a first latch 302, a second latch 304, a third latch 306, and a fourth latch 308. Each latch 302-308 may include an input clock terminal that is coupled to receive the first output clock signal 128 from the primary clock gating cell 102 of FIG. 1. The first latch 302 may include a data input terminal that is coupled to receive a ground signal (e.g., a logical "0" data value).

The shift register 108 may also include a multiplexer 310, a multiplexer 312, a multiplexer 314, a logical gate 316, a logical gate 318, a logical gate 320, a logical gate 322, and a logical gate 324. Each multiplexer 310, 312, 314 may include a first input terminal that is coupled to receive the ground signal. An output of the first latch 302 may be provided to a second input terminal of the first multiplexer 310. The first multiplexer 310 may be configured to provide the ground signal or the output of the first latch 302 to a data input terminal of the second latch 304 based on an output (e.g., a control signal) of the logical gate 322. For example, if the output of the logical gate 322 has a first logical value (e.g., a logical "0" value), the first multiplexer 310 may provide the ground signal to the data input terminal of the second latch 304. If the output of the logical gate 322 has a second logical value (e.g., a logical "1" value), the first multiplexer 310 may provide the output of the first latch 302 to the data input terminal of the second latch 304 (e.g., a data value may be serially shifted from the first latch 302 to the second latch 304).

An output of the second latch 304 may be provided to a second input terminal of the second multiplexer 312. The second multiplexer 312 may be configured to provide the ground signal or the output of the second latch 304 to a data input terminal of the third latch 306 based on an output (e.g., a control signal) of the logical gate 324. For example, if the output of the logical gate 324 has a first logical value (e.g., a logical "0" value), the second multiplexer 312 may provide the ground signal to the data input terminal of the third latch 306. If the output of the logical gate 324 has a second logical value (e.g., a logical "1" value), the second multiplexer 312 may provide the output of the second latch 304 to the data input terminal of the third latch 306 (e.g., a data value may be serially shifted from the second latch 304 to the third latch 306).

An output of the third latch 306 may be provided to a second input terminal of the third multiplexer 314. The third multiplexer 314 may be configured to provide the ground signal or the output of the third latch 306 to a data input terminal of the fourth latch 308 based on an output (e.g., a control signal) of the logical gate 320. For example, if the output of the logical gate 320 has a first logical value (e.g., a logical "0" value), the third multiplexer 314 may provide the ground signal to the data input terminal of the fourth latch 308. If the output of the logical gate 320 has a second logical value (e.g., a logical "1" value), the third multiplexer 314 may provide the output of the third latch 306 to the data input terminal of the fourth latch 308 (e.g., a data value may be serially shifted from the third latch 306 to the fourth latch 308).

A first control signal 340 may be provided to a first input terminal of the logical gate 316, and an inverted version of a second control signal 342 may be provided to a second input terminal of the logical gate 316. If the first control signal 340 has a logical "1" value and the second control signal 342 has a logical "0" value, the logical gate 316 may provide a logical "1" value to a first input terminal of the logical gate 322. As a result, the output of the logical gate 322 may have the second logical value (e.g., the logical "1" value) and the first multiplexer 310 may provide the output of the first latch 302 to the data input terminal of the second latch 304 (e.g., a data value may be serially shifted from the first latch 302 to the second latch 304).

The second control signal 342 may be provided to a first input terminal of the logical gate 318, and an inverted version of the first control signal 340 may be provided to a second input terminal of the logical gate 318. If the second control signal 342 has a logical "1" value and the first control signal 340 has a logical "0" value, the logical gate 318 may provide a logical "1" value to a first input terminal of the logical gate 324 and to a third input terminal of the logical gate 322. As a result, the output of the logical gate 324 may have the second logical value (e.g., the logical "1" value) and the second multiplexer 312 may provide the output of the second latch 304 to the data input terminal of the third latch 306 (e.g., a data value may be serially shifted from the second latch 304 to the third latch 306).

An inverted version of the first control signal 340 may be provided to a first input terminal of the logical gate 320, and an inverted version of the second control signal 342 may be provided to a second input terminal of the logical gate 320. If the first and second control signal 340, 342 have logical "0" values, the logical gate 320 may provide a logical "1" value to a second input terminal of the logical gate 322, to a second input terminal of the logical gate 324, and to a control input terminal of the third multiplexer 314. As a result, the third multiplexer 314 may provide the output of the third latch 306 to the data input terminal of the fourth latch 308 (e.g., a data value may be serially shifted from the third latch 306 to the fourth latch 308).

The shift register 108 of FIG. 3 may be used to form serial shift registers for applying input test patterns to combinational logic of an integrated circuit and for reading out results. Test patterns may be shifted in the scan chains, functional clock signals may be pulsed to test the integrated circuit during a "capture cycle", and the results may be provided ("shifted out") to output pins and compared to expected results. Capture clock pulses may be applied on the scan chains during the capture cycle, and the captured results may be provided to the output pins for analysis (e.g., "at-speed" testing).

Figure 4:
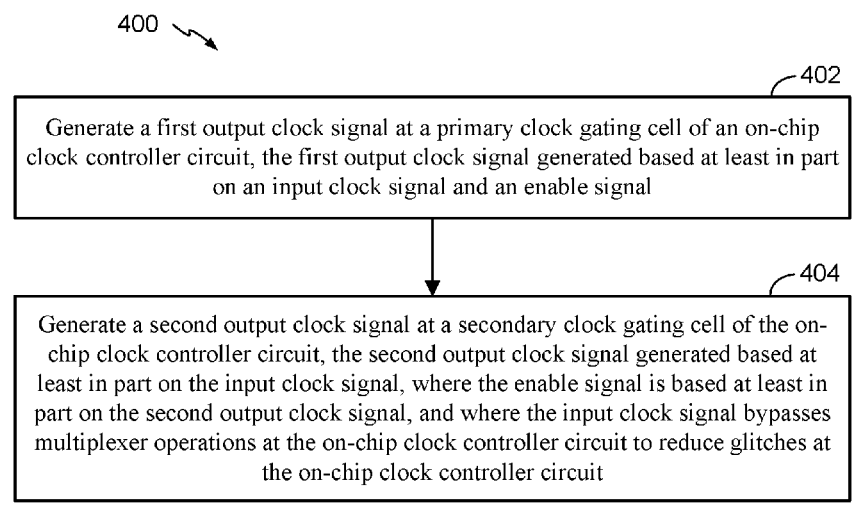
FIG. 4 is a method for reducing glitches at an on-chip clock controller circuit.

Referring to FIG. 4, a method 400 for reducing glitches at an on-chip clock controller circuit is shown. The method 400 may be performed by one or more components of the OCC circuit 100 of FIGS. 1-2.

The method 400 includes generating a first output clock signal at a primary clock gating cell of an OCC circuit, at 402. The first output clock signal may be generated based at least in part on an input clock signal and an enable signal. For example, referring to FIG. 1, the primary clock gating cell 102 may generate the first output clock signal 128 based on the input clock signal 116, the enable signal 126, and the first test enable signal 118. The first output clock signal 128 may be provided to the shift register 108. Thus, if the primary clock gating cell 102 is in an active state, the primary clock gating cell 102 may enable the shift register 108 to store data values indicative of a capture pulse or a launch pulse.

The input clock signal may be received from a multiplexer that is external to the OCC circuit. For example, referring to FIG. 2, the input clock signal 116 may be received from the multiplexer 202. The input clock signal 116 may be selected from a first clock signal 220 having a first frequency and a second clock signal 222 having a second frequency.

A second output clock signal may be generated at a secondary clock gating cell of the OCC circuit, at 404. The second output clock signal may be generated based at least in part on the input clock signal, and the enable signal may be based at least in part on the second output clock signal. The input clock signal may bypass multiplexer operations at the OCC circuit to reduce glitches at the OCC circuit. For example, referring to FIG. 1, the secondary clock gating cell 104 may generate the second output clock signal 124 based on the input clock signal 116 and the second test enable signal 122. The second output clock signal 124 may be an asynchronous signal that is provided to the synchronization circuit 106. According to one implementation, the primary clock gating cell 102 may comprise a first latch and the secondary clock gating cell 104 may comprise a second latch.

The method 400 may also include generating a data signal at a shift register of the OCC circuit. The data signal may be generated based at least in part on the first output clock signal. For example, referring to FIG. 1, the shift register 108 may generate the data signal 130 (e.g., a control value) based on the first output clock signal 128. The data signal 130 may have a first logical value (e.g., a logical "0" value) or a second logical value (e.g., a logical "1" value).

The method 400 may also include generating an OCC clock signal based on the data signal and the enable signal. For example, referring to FIG. 1, the logical gate 110 may generate the OCC clock signal 140 based on the data signal 130 and the enable signal 126. The OCC clock signal 140 may toggle if the data signal 130 has the second logical value corresponding to a capture mode and may not toggle if the data signal 130 has the first logical value corresponding to a launch mode. Thus, during manufacturing tests for a transition delay fault, the data signal 130 from the shift register 108 may control whether the OCC clock signal 140 has a capture pulse or a launch pulse.

The method 400 may also include generating a synchronization signal at a synchronization circuit of the OCC circuit. The synchronization signal may be generated based at least in part on the second output clock signal. For example, referring to FIG. 1, the synchronization circuit 106 may generate the synchronization signal 132. The synchronization signal 132 may be a delay signal that indicates whether the OCC circuit 100 is to generate a launch pulse or a capture pulse. The second output clock signal 124 may be provided to the clock input terminal of each of registers 107, 109 of the synchronization circuit 106. The synchronization circuit 106 may be configured to generate the synchronization signal 132 based at least in part on the second output clock signal 124.

The method 400 may also include generating a preliminary enable signal based on the synchronization signal and an inverted version of a delay fault test signal. For example, referring to FIG. 1, the logical gate 112 may generate the preliminary enable signal 134 based on the synchronization signal 132 and the inverted version of the delay fault test signal 120. The method 400 may also include generating the enable signal based on the preliminary enable signal and a second test enable signal provided to the secondary clock gating cell. For example, referring to FIG. 1, the logical gate 114 may generate the enable signal 126 based on the preliminary enable signal 134 and the second test enable signal 122.

The method 400 of FIG. 4 may reduce glitches based on switching between different frequency clock signals. For example, the input clock signal may bypass multiplexer operations at an OCC circuit to reduce glitches that may otherwise occur if a multiplexer was coupled to the input clock signal.

In particular implementations, the method 400 of FIG. 4 may be implemented via hardware (e.g., a field-programmable gate array (FPGA) device, an application-specific integrated circuit (ASIC), etc.) of a processing unit, such as a central processing unit (CPU), a digital signal processor (DSP), or a controller, via a firmware device, or any combination thereof. As an example, the method 400 can be performed by a processor that executes instructions.

Figure 5:
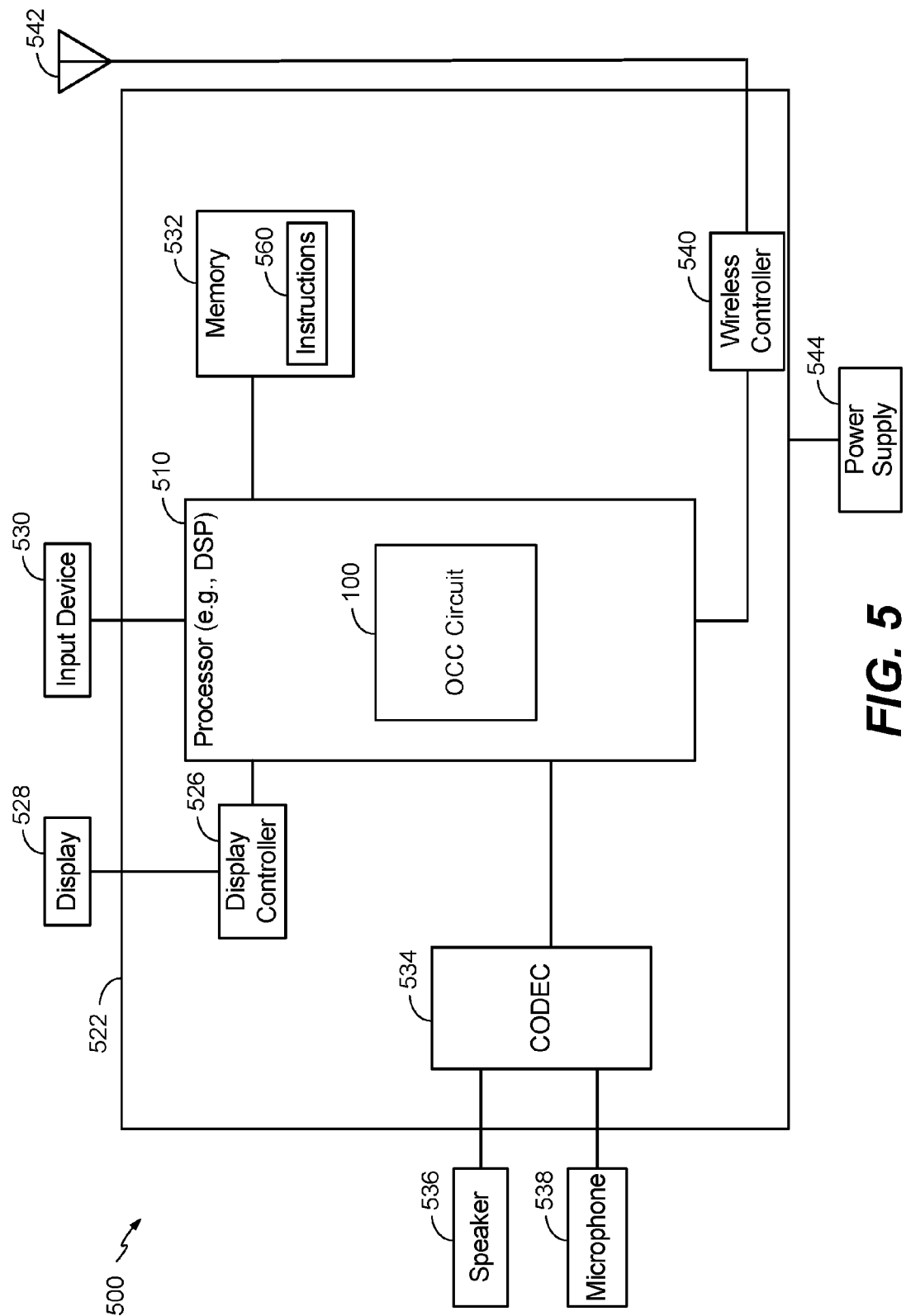
FIG. 5 is a block diagram of a device that includes the OCC circuit of FIG. 1.

Referring to FIG. 5, a block diagram of a device 500 is depicted. The device 500 includes a processor 510 (e.g., a central processing unit (CPU), a digital signal processor (DSP), etc.) coupled to a memory 532. The processor 510 may include the OCC circuit 100 of FIG. 1.

The memory 532 may be a memory device, such as a random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). The memory device may include instructions (e.g., the instructions 560) that, when executed by a computer (e.g., processor 510), may cause the computer to perform the method 400 of FIG. 4.

FIG. 5 also shows a display controller 526 that is coupled to the processor 510 and to a display 528. An encoder/decoder (CODEC) 534 may be coupled to the processor 510, as shown. A speaker 536 and a microphone 538 can be coupled to the CODEC 534. FIG. 5 also shows a wireless controller 540 coupled to the processor 510 and to an antenna 542. In a particular implementation, the processor 510, the display controller 526, the memory 532, the CODEC 534, and the wireless controller 540 are included in a system-in-package or system-on-chip device (e.g., a mobile station modem (MSM)) 522. In a particular implementation, an input device 530, such as a touchscreen and/or keypad, and a power supply 544 are coupled to the system-on-chip device 522. Moreover, in a particular implementation, as illustrated in FIG. 5, the display 528, the input device 530, the speaker 536, the microphone 538, the antenna 542, and the power supply 544 are external to the system-on-chip device 522. However, each of the display 528, the input device 530, the speaker 536, the microphone 538, the antenna 542, and the power supply 544 can be coupled to a component of the system-on-chip device 522, such as an interface or a controller.

In conjunction with the described implementations, an OCC circuit includes means for generating a first output clock signal. The means for generating the first output clock signal include a first clock input terminal coupled to receive an input clock signal, a first enable input terminal coupled to receive an enable signal, and a first clock output terminal configured to generate the first output clock signal based at least in part on the input clock signal and the enable signal. For example, the means for generating the first output clock signal may include the primary clock gating cell 102 of FIG. 1, one or more other devices, circuits, modules, or instructions to generate the second output clock signal, or any combination thereof.

The OCC circuit may also include means for generating a second output clock signal. The means for generating the second output clock signal may include a second clock input terminal coupled to receive the input clock signal and a second clock output terminal configured to generate the second output clock signal based at least in part on the input clock signal. The enable signal may be based at least in part on the second output clock signal. For example, the means for generating the second output clock signal may include the secondary clock gating cell 104 of FIG. 1, one or more other devices, circuits, modules, or instructions to generate the second output clock signal, or any combination thereof.

Figure 6:
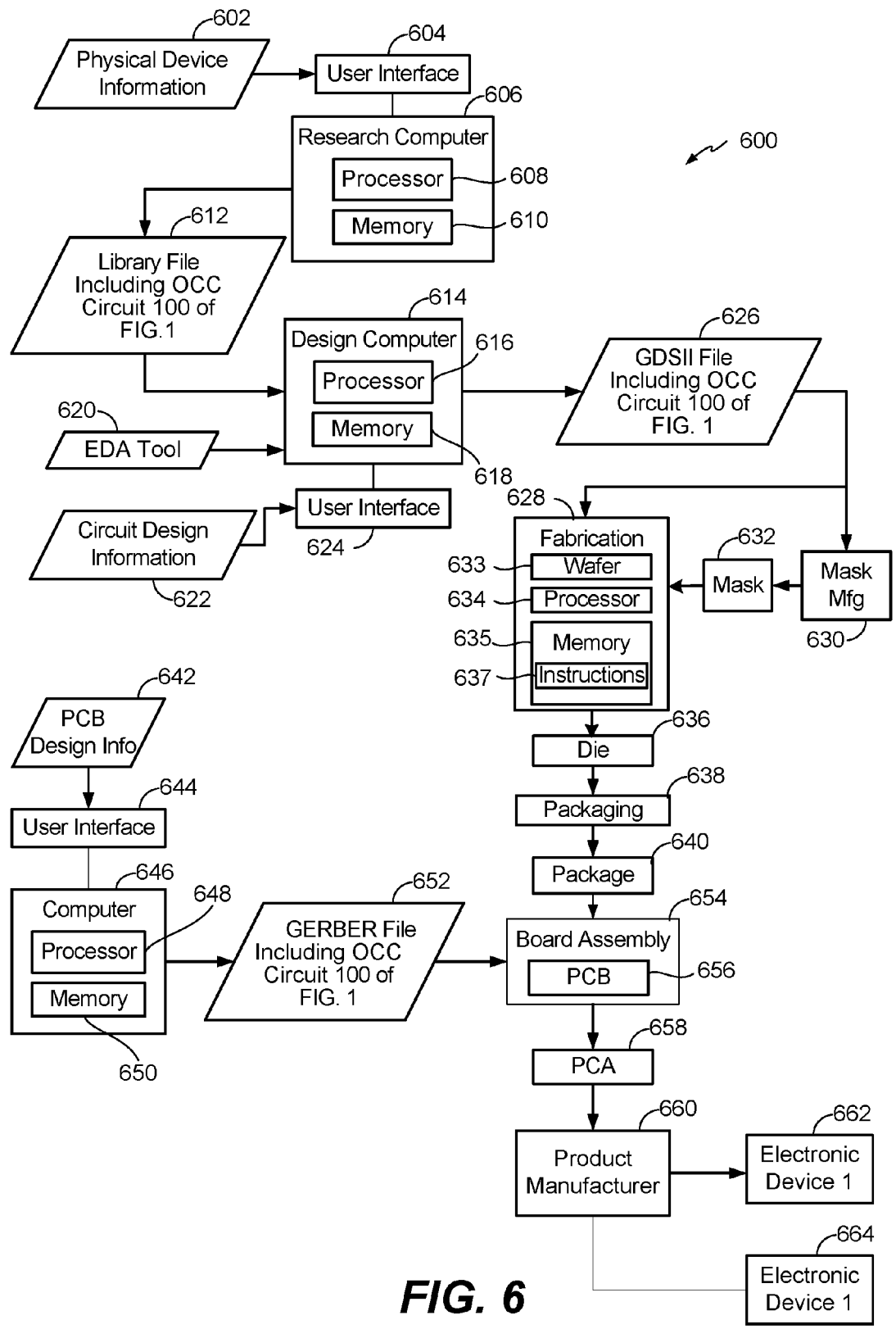
FIG. 6 is a data flow diagram of a particular illustrative implementation of a manufacturing process to manufacture electronic devices that include the OCC circuit of FIG. 1.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices, such as a communications device (e.g., a mobile phone), a tablet, a laptop, a personal digital assistant (PDA), a set top box, a music player, a video player, an entertainment unit, a navigation device, a fixed location data unit, or a computer. FIG. 6 depicts a particular illustrative implementation of an electronic device manufacturing process 600.

Physical device information 602 is received at the manufacturing process 600, such as at a research computer 606. The physical device information 602 may include design information representing at least one physical property of a semiconductor device, such as a device that includes the OCC circuit 100 of FIG. 1, the system 200 of FIG. 2, or any combination thereof. For example, the physical device information 602 may include physical parameters, material characteristics, and structure information that is entered via a user interface 604 coupled to the research computer 606. The research computer 606 includes a processor 608, such as one or more processing cores, coupled to a computer readable medium such as a memory 610. The memory 610 may store computer readable instructions that are executable to cause the processor 608 to transform the physical device information 602 to comply with a file format and to generate a library file 612.

In a particular implementation, the library file 612 includes at least one data file including the transformed design information. For example, the library file 612 may include a library of semiconductor devices that includes the OCC circuit 100 of FIG. 1, the system 200 of FIG. 2, or any combination thereof, that is provided for use with an electronic design automation (EDA) tool 620.

The library file 612 may be used in conjunction with the EDA tool 620 at a design computer 614 including a processor 616, such as one or more processing cores, coupled to a memory 618. The EDA tool 620 may be stored as processor executable instructions at the memory 618 to enable a user of the design computer 614 to design a device that includes the OCC circuit 100 of FIG. 1, the system 200 of FIG. 2, or any combination thereof, of the library file 612. For example, a user of the design computer 614 may enter circuit design information 622 via a user interface 624 coupled to the design computer 614. The circuit design information 622 may include design information representing at least one physical property of a semiconductor device that includes the OCC circuit 100 of FIG. 1, the system 200 of FIG. 2, or any combination thereof. To illustrate, the circuit design property may include identification of particular circuits and relationships to other elements in a circuit design, positioning information, feature size information, interconnection information, or other information representing a physical property of a semiconductor device.

The design computer 614 may be configured to transform the design information, including the circuit design information 622, to comply with a file format. To illustrate, the file formation may include a database binary file format representing planar geometric shapes, text labels, and other information about a circuit layout in a hierarchical format, such as a Graphic Data System (GDSII) file format. The design computer 614 may be configured to generate a data file including the transformed design information, such as a GDSII file 626 that includes information describing a device that includes the system 100 of FIG. 1, the system 200 of FIG. 2, or any combination thereof. To illustrate, the data file may include information corresponding to a system-on-chip (SOC) that includes the OCC circuit 100 of FIG. 1, the system 200 of FIG. 2, or any combination thereof, and that also includes additional electronic circuits and components within the SOC.

The GDSII file 626 may be received at a fabrication process 628 to manufacture a semiconductor device that includes the OCC circuit 100 of FIG. 1, the system 200 of FIG. 2, or any combination thereof, according to transformed information in the GDSII file 626. For example, a device manufacture process may include providing the GDSII file 626 to a mask manufacturer 630 to create one or more masks, such as masks to be used with photolithography processing, illustrated as a representative mask 632. The mask 632 may be used during the fabrication process to generate one or more wafers 633, which may be tested and separated into dies, such as a representative die 636. The die 636 includes a circuit including the OCC circuit 100 of FIG. 1, the system 200 of FIG. 2, or any combination thereof.

In a particular implementation, the fabrication process 628 may be initiated by or controlled by a processor 634. The processor 634 may access a memory 635 that includes executable instructions 637, such as computer-readable instructions or processor-readable instructions. The executable instructions may include one or more instructions that are executable by a computer, such as the processor 634. The fabrication process 628 may be implemented by a fabrication system that is fully automated or partially automated. For example, the fabrication process 628 may be automated and may perform processing steps according to a schedule. The fabrication system may include fabrication equipment (e.g., processing tools) to perform one or more operations to form an electronic device.

The fabrication system may have a distributed architecture (e.g., a hierarchy). For example, the fabrication system may include one or more processors, such as the processor 634, one or more memories, such as the memory 635, and/or controllers that are distributed according to the distributed architecture. The distributed architecture may include a high-level processor that controls and/or initiates operations of one or more low-level systems. For example, a high-level portion of the fabrication process 628 may include one or more processors, such as the processor 634, and the low-level systems may each include or may be controlled by one or more corresponding controllers. A particular controller of a particular low-level system may receive one or more instructions (e.g., commands) from a high-level system, may issue sub-commands to subordinate modules or process tools, and may communicate status data back to the high-level system. Each of the one or more low-level systems may be associated with one or more corresponding pieces of fabrication equipment (e.g., processing tools). In a particular implementation, the fabrication system may include multiple processors that are distributed in the fabrication system. For example, a controller of a low-level system component of the fabrication system may include a processor, such as the processor 634.

Alternatively, the processor 634 may be a part of a high-level system, subsystem, or component of the fabrication system. In another implementation, the processor 634 includes distributed processing at various levels and components of a fabrication system.

The die 636 may be provided to a packaging process 638 where the die 636 is incorporated into a representative package 640. For example, the package 640 may include the single die 636 or multiple dies, such as a system-in-package (SiP) arrangement. The package 640 may be configured to conform to one or more standards or specifications, such as Joint Electron Device Engineering Council (JEDEC) standards.

Information regarding the package 640 may be distributed to various product designers, such as via a component library stored at a computer 646. The computer 646 may include a processor 648, such as one or more processing cores, coupled to a memory 650. A printed circuit board (PCB) tool may be stored as processor executable instructions at the memory 650 to process PCB design information 642 received from a user of the computer 646 via a user interface 644. The PCB design information 642 may include physical positioning information of a packaged semiconductor device on a circuit board, the packaged semiconductor device corresponding to the package 640 including a device that includes the OCC circuit 100 of FIG. 1, the system 200 of FIG. 2, or any combination thereof.

The computer 646 may be configured to transform the PCB design information 642 to generate a data file, such as a GERBER file 652 with data that includes physical positioning information of a packaged semiconductor device on a circuit board, as well as layout of electrical connections such as traces and vias, where the packaged semiconductor device corresponds to the package 640 including the OCC circuit 100 of FIG. 1, the system 200 of FIG. 2, or any combination thereof. In other implementations, the data file generated by the transformed PCB design information may have a format other than a GERBER format.

The GERBER file 652 may be received at a board assembly process 654 and used to create PCBs, such as a representative PCB 656, manufactured in accordance with the design information stored within the GERBER file 652. For example, the GERBER file 652 may be uploaded to one or more machines to perform various steps of a PCB production process. The PCB 656 may be populated with electronic components including the package 640 to form a representative printed circuit assembly (PCA) 658.

The PCA 658 may be received at a product manufacture process 660 and integrated into one or more electronic devices, such as a first representative electronic device 662 and a second representative electronic device 664. As an illustrative, non-limiting example, the first representative electronic device 662, the second representative electronic device 664, or both, may be selected from the group of a communications device (e.g., a mobile phone), a tablet, a laptop, a personal digital assistant (PDA), a set top box, a music player, a video player, an entertainment unit, a navigation device, a fixed location data unit, and a computer, into which the OCC circuit 100 of FIG. 1, the system 200 of FIG. 2, or any combination thereof is integrated. As another illustrative, non-limiting example, one or more of the electronic devices 662 and 664 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. In addition to remote units according to teachings of the disclosure, implementations of the disclosure may be suitably employed in any device which includes active integrated circuitry including memory and on-chip circuitry.

A device that includes the OCC circuit 100 of FIG. 1, the system 200 of FIG. 2, or any combination thereof, may be fabricated, processed, and incorporated into an electronic device, as described in the illustrative process 600. The electronic device may include a communications device, a tablet, a laptop, a set top box, a music player, a video player, an entertainment unit, a navigation device, a personal digital assistant (PDA), a fixed location data unit, or a computer. One or more aspects of the implementations disclosed with respect to FIGS. 1-5 may be included at various processing stages, such as within the library file 612, the GDSII file 626, and the GERBER file 652, as well as stored at the memory 610 of the research computer 606, the memory 618 of the design computer 614, the memory 650 of the computer 646, the memory of one or more other computers or processors (not shown) used at the various stages, such as at the board assembly process 654, and also incorporated into one or more other physical implementations such as the mask 632, the die 636, the package 640, the PCA 658, other products such as prototype circuits or devices (not shown), or any combination thereof. Although various representative stages of production from a physical device design to a final product are depicted, in other implementations fewer stages may be used or additional stages may be included. Similarly, the process 600 may be performed by a single entity or by one or more entities performing various stages of the process 600.

Those of skill would further appreciate that the various illustrative logical blocks, configurations, modules, circuits, and algorithm steps described in connection with the implementations disclosed herein may be implemented as electronic hardware, computer software executed by a processing device such as a hardware processor, or combinations of both. Various illustrative components, blocks, configurations, modules, circuits, and steps have been described above generally in terms of their functionality. Whether such functionality is implemented as hardware or executable software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the implementations disclosed herein may be embodied directly in hardware, in a software module executed by a processor, or in a combination of the two. A software module may reside in a memory device, such as random access memory (RAM), magnetoresistive random access memory (MRAM), spin-torque transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, or a compact disc read-only memory (CD-ROM). An exemplary memory device is coupled to the processor such that the processor can read information from, and write information to, the memory device. In the alternative, the memory device may be integral to the processor. The processor and the storage medium may reside in an application-specific integrated circuit (ASIC). The ASIC may reside in a computing device or a user terminal. In the alternative, the processor and the storage medium may reside as discrete components in a computing device or a user terminal.

The previous description of the disclosed implementations is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An on-chip clock controller circuit comprising:
   a primary clock gating cell comprising:
      a first clock input terminal coupled to receive an input clock signal;
      a first enable input terminal coupled to receive an enable signal; and
      a first clock output terminal configured to generate a first output clock signal based at least in part on the input clock signal and the enable signal;
   a secondary clock gating cell comprising:
      a second clock input terminal coupled to receive the input clock signal; and
      a second clock output terminal configured to generate a second output clock signal based at least in part on the input clock signal, wherein the enable signal is based at least in part on the second output clock signal; and
   a shift register coupled to receive the first output clock signal, the shift register configured to generate a data signal based at least in part on the first output clock signal.

2. The on-chip clock controller circuit of claim 1, wherein the primary clock gating cell further comprises a first test enable input terminal coupled to receive a first test enable signal, wherein first output clock signal is generated based on the input clock signal, the enable signal, and the first test enable signal.

3. The on-chip clock controller circuit of claim 1, further comprising a first logical gate, the first logical gate comprising:
   a first input terminal coupled to receive the data signal from the shift register;
   a second input terminal coupled to receive the enable signal; and
   an output terminal configured to generate an on-chip clock controller clock signal based on the data signal and the enable signal.

4. The on-chip clock controller circuit of claim 1, further comprising a synchronization circuit coupled to receive the second output clock signal from the second clock output terminal of the secondary clock gating cell, the synchronization circuit configured to generate a synchronization signal based at least in part on the second output clock signal.

5. The on-chip clock controller circuit of claim 4, further comprising a second logical gate, the second logical gate comprising:
   a first input terminal coupled to receive the synchronization signal from the synchronization circuit;
   a second input terminal coupled to receive an inverted version of a delay fault test signal; and
   an output terminal configured to generate a preliminary enable signal based on the synchronization signal and the inverted version of the delay fault test signal.

6. The on-chip clock controller circuit of claim 5, further comprising a third logical gate, the third logical gate comprising:
   a first input terminal coupled to receive the preliminary enable signal from the output terminal of the second logical gate;
   a second input terminal coupled to receive a second test enable signal; and
   an output terminal configured to generate the enable signal based on the preliminary enable signal and the second test enable signal.

7. The on-chip clock controller circuit of claim 6, wherein the secondary clock gating cell further comprises:
   a second enable input terminal coupled to receive the second test enable signal; and
   a second test enable input terminal coupled to receive the second test enable signal,
   wherein the second output clock signal is generated based on the input clock signal and the second test enable signal.

8. The on-chip clock controller circuit of claim 1, wherein the input clock signal is received from a multiplexer that is external to the on-chip clock controller circuit, the input clock signal selected from a first clock signal having a first frequency and a second clock signal having a second frequency.

9. The on-chip clock controller circuit of claim 1, wherein the primary clock gating cell comprises a first latch, and wherein the secondary clock gating cell comprises a second latch.

10. The on-chip clock controller circuit of claim 1, wherein the input clock signal bypasses multiplexer operations at the on-chip clock controller circuit.

11. The on-chip clock controller circuit of claim 10, wherein bypassing multiplexer operations reduces glitches at the on-chip clock controller circuit.

12. A method of reducing glitches at an on-chip clock controller circuit, the method comprising:
   generating a first output clock signal at a primary clock gating cell of the on-chip clock controller circuit, the first output clock signal generated based at least in part on an input clock signal and an enable signal;
   generating a second output clock signal at a secondary clock gating cell of the on-chip clock controller circuit, the second output clock signal generated based at least in part on the input clock signal, wherein the enable signal is based at least in part on the second output clock signal, and wherein the input clock signal bypasses multiplexer operations at the on-chip clock controller circuit to reduce glitches at the on-chip clock controller circuit; and
   generating a data signal at a shift register of the on-chip clock controller circuit, the data signal generated based at least in part on the first output clock signal.

13. The method of claim 12, wherein the first output clock signal is generated based on the input clock signal, the enable signal, and a first test enable signal provided to the primary clock gating cell.

14. The method of claim 12, further comprising generating an on-chip clock controller clock signal based on the data signal and the enable signal.

15. The method of claim 12, further comprising generating a synchronization signal at a synchronization circuit of the on-chip clock controller circuit, the synchronization signal generated based at least in part on the second output clock signal.

16. The method of claim 15, further comprising generating a preliminary enable signal based on the synchronization signal and an inverted version of a delay fault test signal.

17. The method of claim 16, further comprising generating the enable signal based on the preliminary enable signal and a second test enable signal provided to the secondary clock gating cell.

18. The method of claim 12, wherein the input clock signal is received from a multiplexer that is external to the on-chip clock controller circuit, the input clock signal selected from a first clock signal having a first frequency and a second clock signal having a second frequency.

19. The method of claim 12, wherein the primary clock gating cell comprises a first latch, and wherein the secondary clock gating cell comprises a second latch.

20. A non-transitory computer-readable medium comprising instructions for reducing glitches at an on-chip clock controller circuit, the instructions, when executed by a processor, cause the processor to perform operations comprising:
   generating a first output clock signal at a primary clock gating cell of the on-chip clock controller circuit, the first output clock signal generated based at least in part on an input clock signal and an enable signal;
   generating a second output clock signal at a secondary clock gating cell of the on-chip clock controller circuit, the second output clock signal generated based at least in part on the input clock signal, wherein the enable signal is based at least in part on the second output clock signal, and wherein the input clock signal bypasses multiplexer operations at the on-chip clock controller circuit to reduce glitches at the on-chip clock controller circuit; and
   generating a data signal at a shift register of the on-chip clock controller circuit, the data signal generated based at least in part on the first output clock signal.

21. The non-transitory computer-readable medium of claim 20, wherein the first output clock signal is generated based on the input clock signal, the enable signal, and a first test enable signal provided to the primary clock gating cell.

22. The non-transitory computer-readable medium of claim 20, wherein the operations further comprise generating an on-chip clock controller clock signal based on the data signal and the enable signal.

23. The non-transitory computer-readable medium of claim 20, wherein the operations further comprise generating a synchronization signal at a synchronization circuit of the on-chip clock controller circuit, the synchronization signal generated based at least in part on the second output clock signal.

24. The non-transitory computer-readable medium of claim 23, wherein the operations further comprise generating a preliminary enable signal based on the synchronization signal and an inverted version of a delay fault test signal.

25. The non-transitory computer-readable medium of claim 24, wherein the operations further comprise generating the enable signal based on the preliminary enable signal and a second test enable signal provided to the secondary clock gating cell.

26. An on-chip clock controller circuit comprising:
  means for generating a first output clock signal, the means for generating the first output clock signal comprising:
    a first clock input terminal coupled to receive an input clock signal;
    a first enable input terminal coupled to receive an enable signal; and
    a first clock output terminal configured to generate the first output clock signal based at least in part on the input clock signal and the enable signal;
  means for generating a second output clock signal, the means for generating the second output clock signal comprising:
    a second clock input terminal coupled to receive the input clock signal; and
    a second clock output terminal configured to generate the second output clock signal based at least in part on the input clock signal, wherein the enable signal is based at least in part on the second output clock signal; and
  means for generating a data signal, the data signal generated based at least in part on the first output clock signal.

27. The on-chip clock controller circuit of claim 26, wherein the input clock signal bypasses multiplexer operations at the on-chip clock controller circuit.

* * * * *